US011575059B2

(12) United States Patent
Mundus et al.

(10) Patent No.: US 11,575,059 B2
(45) Date of Patent: Feb. 7, 2023

(54) PHOTOVOLTAIC MODULE

(71) Applicant: BASF Coatings GmbH, Münster (DE)

(72) Inventors: Markus Mundus, Muenster (DE); Sven Olle Krabbenborg, Muenster (DE); Patrice Bujard, Cossonay-ville (CH)

(73) Assignee: BASF Coatings GmbH, Münster (DE)

( * ) Notice: Subject to any disclaimer, the term of this patent is extended or adjusted under 35 U.S.C. 154(b) by 58 days.

(21) Appl. No.: 17/312,525

(22) PCT Filed: Dec. 11, 2019

(86) PCT No.: PCT/EP2019/084640
§ 371 (c)(1),
(2) Date: Jun. 10, 2021

(87) PCT Pub. No.: WO2020/120573
PCT Pub. Date: Jun. 18, 2020

(65) Prior Publication Data
US 2022/0149220 A1 May 12, 2022

(30) Foreign Application Priority Data

Dec. 12, 2018 (EP) .................................... 18212065
Apr. 25, 2019 (EP) .................................... 19171121

(51) Int. Cl.
H01L 31/068 (2012.01)
H01L 31/046 (2014.01)
(Continued)

(52) U.S. Cl.
CPC ........ H01L 31/0684 (2013.01); H01L 31/046 (2014.12); H01L 31/048 (2013.01); H01L 31/0547 (2014.12)

(58) Field of Classification Search
CPC ............... H01L 31/0236; H01L 31/046; H01L 31/048; H01L 31/0488; H01L 31/049;
(Continued)

(56) References Cited

U.S. PATENT DOCUMENTS 4,235,643 A 11/1980 Amick
5,122,902 A 6/1992 Benson
(Continued)

FOREIGN PATENT DOCUMENTS

EP 2234177 A1 9/2010
EP 3214659 A1 9/2017
(Continued)

OTHER PUBLICATIONS

"Paints and Coatings", Ullmann's Encyclopedia of Industrial Chemistry, ed. Elvers, et al., 5th Edition, vol. A18: Nucleic acids to Parasympatholytics and Parasympathomimetics, 1991, pp. 451-453.
European Search Report for EP Patent Application No. 18212065.9, dated Mar. 19, 2019, 3 pages.
(Continued)

Primary Examiner — Mayla Gonzalez Ramos
(74) Attorney, Agent, or Firm — Armstrong Teasdale LLP

(57) ABSTRACT

Described herein is a photovoltaic module, which includes PV cells capable of converting light incoming from a front side and from a rear side (3) and a transparent rear side including a rear surface carrying a structured layer (9), where the lower surface of the structured layer (9) is the lower surface of the module, and where the surface of layer (9) is structured by parallel V-shaped grooves of depth h2 or less than h2, where the lateral faces of the grooves of depth less than h2 form a groove angle beta and adjacent faces of neighbouring grooves form a peak of apex angle alpha, characterized in that h2 is from the range 5 to 200 micrometer, and each pair of neighbouring grooves includes one
(Continued)

groove of depth h2 and one groove of depth (h2−h1), where h1 ranges from 0.1 h2 to 0.9 h2.

20 Claims, 5 Drawing Sheets

(51) Int. Cl.
*H01L 31/054* (2014.01)
*H01L 31/048* (2014.01)

(58) Field of Classification Search
CPC .............. H01L 31/0547; H01L 31/056; H01L 31/0684
See application file for complete search history.

(56) References Cited

U.S. PATENT DOCUMENTS

| | | |
|---|---|---|
| 8,581,094 B2 | 11/2013 | Patel et al. |
| 2010/0252107 A1* | 10/2010 | Suga .................... H01L 31/056 136/259 |

FOREIGN PATENT DOCUMENTS

| | | |
|---|---|---|
| JP | H11307791 A | 11/1999 |
| WO | 2012166448 A1 | 12/2012 |
| WO | 2012176126 A1 | 12/2012 |

OTHER PUBLICATIONS

European Search Report for EP Patent Application No. 19171121.7, dated Dec. 9, 2019, 3 pages.

Onusseit, et al., "Adhesives, 2. Applications", Ullmann's Encyclopedia of Industrial Chemistry, Ed. Ley, et al., vol. 1, Jan. 15, 2010, pp. 483-535.

Wicht, et al., "Nanoporous Films with Low Refractive Index for Large-Surface Broad-Band Anti-Reflection Coatings", Macromolecular Materials and Engineering, vol. 295, Issue 7, Jul. 12, 2010, pp. 628-636.

International Search Report and Written Opinion of corresponding PCT/EP201 9/084640, dated Feb. 12, 2020, 11 Pages.

* cited by examiner

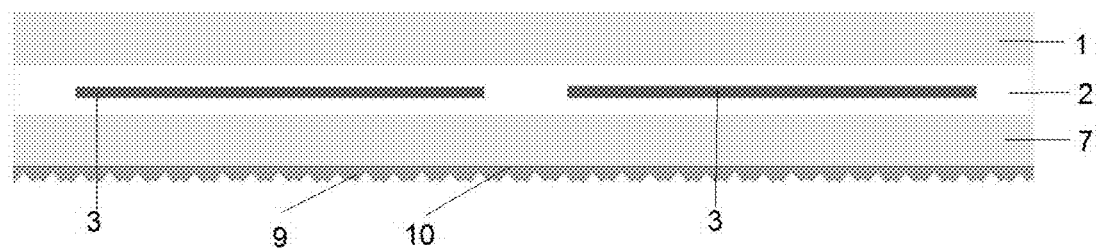
FIG. 4
Figure 5
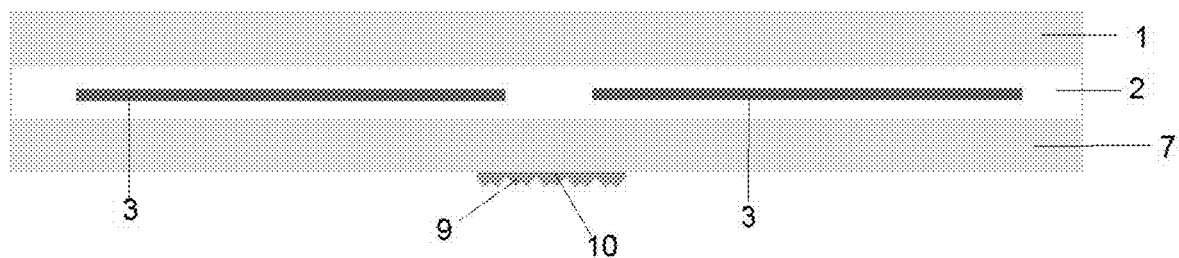
FIG. 5

PHOTOVOLTAIC MODULE

CROSS-REFERENCE TO RELATED APPLICATIONS

This application is a U.S. National Phase Application of International Patent Application No. PCT/EP2019/084640, filed Dec. 11, 2019, which claims priority to European Patent Application No. 18212065.9, filed Dec. 12, 2018, and to European Patent Application No. 19171121.7, filed Apr. 25, 2019, the entire contents of each of which are hereby incorporated by reference herein.

Present invention relates to a photovoltaic module comprising bifacial photovoltaic (PV) cells, which are capable of converting light incoming from the front side and from the rear side. The module is covered by a reflector of a transparent material on its back side comprising a specific surface structure, which provides efficient rear light entry and reflection of unused light from the module's front side towards the cells. The invention further relates to a method for improving efficiency of a bifacial module by structuring its back side, as well as the use of a structured layer or sheet of transparent material for improving the efficiency of a bifacial photovoltaic module.

Typical photovoltaic modules, also known as solar modules, comprise an array of photovoltaic (PV) cells, generally formed from one or more "strings" of PV cells, with each string consisting of a plurality of PV cells arranged in a row and electrically connected in series. The PV cells are typically arranged on transparent polymer layer or encapsulated in such a layer, such as generally described in U.S. Pat. No. 8,581,094 (Patel et al). In some embodiments, the PV module includes encapsulant on both sides of the PV cell. Two panels of glass or other suitable polymeric material usually are positioned adjacent and bonded to the front side and back side of the encapsulant. The two panels are transparent to solar radiation and are referred to as front side layer or front cover member, and rear side layer or back sheet (also recalled as back plate), respectively. The encapsulant is a light-transparent polymer arranged around the PV cells (in optical contact with the cell, such that it encapsulates the PV cells) and is also bonded to the front side layer and back sheet so as to physically seal off the cells. This laminated construction provides mechanical support for the cells and also protects them against damage due to environmental factors such as wind, snow and ice.

In principle, modules containing bifacial cells allow for usage of light reaching the cell from the "wrong" side (i.e. from the rear), and thus may provide a potential for increased efficiency.

The basic module construction still loses a certain fraction of light reaching the module. FIG. 1 gives a schematic representation of a photovoltaic module comprising cells connected by a wiring (shown as black line) and embedded in a polymeric material (typically EVA), which are covered on top or on both sides with a protecting sheet (here shown as glass sheets). While larger fractions of the sunlight directly falling on the cells (B) is converted into electricity, light falling into the gap between cells (A), light partially transmitted through the cells (B) and light reflected from the ground towards the module's back side (C) often gets lost.

Typical light paths of such "lost light" are depicted in FIGS. 1 and 2, FIG. 2 showing the cross section of the modules with front plate (1, typically glass), PV cell (3), encapsulant (2, e.g. EVA), back plate (7, e.g. another glass plate or the lower part of the encapsulant). If not reflected on the lower surface, light following paths I-III gets lost to large extent, while light reaching the module from the back side may reach the cells (light path IV). A further loss of light is caused by reflections on the back side of the PV cell: While the cell's front sides commonly carry an anti-reflection structure (textured PV cells carrying such structure are also known as "black silicon"), such anti-reflection properties typically are missing on the cell's back side, which may leading to additional losses by reflection (not shown in FIG. 2). Some proposals have been made how to recapture light passing the cells (especially on paths I-III of FIG. 2) as explained inter alia in U.S. Pat. No. 4,235,643.

It has now been found that disadvantages in both constructions shown in FIGS. 1 and 2 may be avoided, and an improved efficiency of the bifacial module may be obtained, if a reflecting layer is applied to the modules back side, whose structure provides an improved redirection of "lost light" coming from the module's front while improving light entry from the module's rear side.

The invention thus primarily pertains to a photovoltaic module comprising one or more PV cells (3), which are able to convert light incoming from the front side and from the rear side, and a transparent rear side comprising a rear surface carrying a structured layer (9), wherein the lower surface of the structured layer (9) is the lower surface of the module, and wherein the lower surface of said layer (9) comprises microstructures containing parallel V-shaped grooves, which are of depth h2 or less than h2. Lateral faces of said grooves of depth less than h2 form a groove angle beta, and adjacent faces of neighbouring grooves form a peak of apex angle alpha, characterized in that h2 is from the range 5 to 200 micrometer, especially 10 to 60 micrometer, and each pair of neighbouring grooves comprises one groove of depth h2 and one groove of depth (h2−h1), wherein h1 ranges from 0.1 h2 to 0.9 h2, preferably from 0.1 h2 to 0.8 h2.

The present photovoltaic module's front side is thus designed for typically receiving direct sunlight incoming from the front side. The surface of layer (9), which forms the rear surface of the module, thus is designed for receiving light falling on the module's back side, such as light scattered from the albedo, while providing reflection of "unused" light coming from the front side but not absorbed by the cells; it comprises a structure consisting of a multitude of parallel grooves, wherein grooves of depth h2 alternate with grooves of depth less than h2. Depth of a V-shaped groove is to be understood as the distance, measured rectangular to the lower surface, between apex and deepest point of said groove.

Front side and rear side of the photovoltaic module typically are flat and about parallel to each other; the area of each side is defined by the module's length (x-axis about parallel to the front and rear side, x-axis intended for mounting parallel to the ground) and its height (y-axis about parallel to the front and rear side, and perpendicular to the x-axis).

These microstructures are at least arranged below the gaps between cells (3), see FIG. 5, or preferably across the whole back sheet (7), as exemplified in FIG. 4, or across the whole rear surface formed by the encapsulant (without back sheet, see FIG. 6).

Consequently, the photovoltaic module according to the invention generally does not contain a metal or diffuse reflector (i.e. reflector of a non-transparent material).

Since the present modules are especially efficient using light falling on the modules back side, they are preferably mounted over surfaces having a reflectivity (albedo) of 5% or more, especially of 20% or more; examples for such surfaces are roof tiles, concrete, sand. The module may be oriented parallel or tilted with respect to the reflecting surface. Also, mounting in about rectangular orientation over the surface is possible, such as vertical mounting above the ground (e.g. as space separator), allowing light income from both sides.

Hereafter, the term "film" is synonymous with a sheet and like structures. The expression "structured reflector sheet" or "microstructured reflector sheet" is synonymous with reflector sheet, structured reflector film, light reflecting film, structured back sheet.

The term "upper", "top" and "front" denotes the side directed towards the incident sunlight and the term "low", "lower", "below", "rear" and "back" denotes the opposite side.

The term "back sheet" or "back plate", as used for the PV module according to the invention, denotes the transparent lower cover of the photovoltaic module comprising a surface, on which the present structured layer is applied (thus also recalled as "substrate sheet"). The substrate sheet may consist of one layer (e.g. a glass sheet) or 2 or more layers (e.g. glass sheet or polymer sheet plus one or more polymer layers; an example for a back sheet comprises an EVA primer, a PET core consisting of 1 or more layers, followed by a UV coating as a protection layer).

The term "back plane" denotes the lower surface of the back sheet, which is typically flat and parallel to the PV cells, and on which the present structured layer is applied.

The terms "solar cell" or "PV cell" denotes any photovoltaic cell, such as monocrystalline cells, multicrystalline cells, ribbon silicon cells, thin film cells, etc.; cells contained in the present PV module are capable of converting light incoming from the front side and from the rear side, as typically realized by bifacial cells.

The term "transparent" denotes a transmission of visual light essentially without scattering, typically effecting solar light transmission of more than 90% with scattering less than 10%. A transparent material thus generally denotes a material of optical quality. A microstructure comprising inclined planes and consisting of transparent material thus provides transmission through said material, while effecting light refraction or deflection on each of its microplanes generally in accordance with geometrical optics.

The term "encapsulant" denotes a transparent polymer material enclosing ("embedding") the PV cells from all sides; a typical encapsulant material is EVA.

The term "Angstrom" denotes a length of $10^{-10}$ meter.

The term "solar module" is synonymous with a photovoltaic module or PV module.

The assembly forming the present solar module generally is mounted in a way to distinguish between front side and back side.

Wherever mentioned, the refractive index of a material is as determined for a radiation of 589 nm (sodium D line), if not indicated otherwise.

The term "about" typically denotes a dimensioning which may vary up to plus or minus 5%, and especially plus or minus 2%. For example, a layer thickness of "about 2 mm" denotes 1.9 to 2.1 mm; "about rectangular" denotes an angle of 85.5 to 94.5°; correspondingly, "about parallel" denotes a potential deviation from parallelism up to plus or minus 4.5°, especially plus or minus 1.8°, "about flat" denotes a potential deviation of tangents, e.g. on one side face intersecting at the groove, from parallelism up to 4.5°, especially up to 1.8°.

The solar module according to the invention comprises a plurality of electrically interconnected bifacial solar cells having a front side receiving the directly incident light. The solar cells are arranged in a pattern where at least two cells are typically spaced from each other by gap areas with no solar cells, and the structured layer at least overlaps with the areas free of solar cells.

The principle of the invention is independent of the current conventional column/row arrangement of solar cells in solar modules. According to one embodiment, the solar cells are arranged in rows and columns, where at least one of the rows or columns are being spaced from each other.

The present structured layer (9), together with its optional carrier film (10) is in direct optical contact with the back sheet (7) and/or the encapsulant (2) (i.e. the polymer layer or lowest polymer layer below the cells).

The photovoltaic module according to the invention generally contains a front plate (1), which is advantageously covered by an anti reflex layer; the front plate (1) covers the module core containing bifacial photovoltaic cells (3), which are embedded in a transparent polymer material (2; also recalled as encapsulant). The other side of the cells (i.e. back side, opposite to incoming light) is optionally covered by a transparent back sheet (7). According to the invention, the lower module surface is, at least in part, covered by the transparent structured layer (9), which thus forms at least a part of the module's lower surface. Cells such as common silicon-based PV cells are typically separated by a gap, e.g. of 1 to 10 mm width; the structured layer (9) then covers the back plane at least below these gaps.

In another embodiment of the invention, PV cells (3) incorporated in the module do not require such gaps, as it is typically the case for thin film modules often based on organic PV cells, or in modules containing the PV cells in an overlapping arrangement (shingled). In such gapless modules of the invention, the structured layer (9) preferably covers the back plane at least below the PV cells. In a further preferred embodiment, the structured layer covers the whole back plane.

In a preferred embodiment of the invention, the structured layer (9) covers a polymer film (10) standing in optical contact with the module's back sheet (7), or the structured layer (9) covers a polymer film (7) in direct optical contact with the encapsulant (2), each optionally by applying an adhesive interlayer.

In a further embodiment, the structured layer (9) directly covers the module's back sheet (7), which back sheet (7) is a polymer sheet or glass sheet; typically in these embodiments, the structured layer may be a structured radiation cured coating (9) e.g. on glass sheet or polymer sheet (7), or an embossed layer on the polymer sheet (7) or the embossed surface of polymer sheet (7).

The structured layer (9) comprises a multitude of parallel grooves and typically covers at least 90% of the gap area between cells, and especially covers at least 90% of the module's rear surface. In a preferred embodiment, the structured surface (9) may cover the whole back plane surface, which is typically to be understood as covering more than 90%, especially more than 95%, of the module surface below cells and gaps. Parallel grooves of layer (9) typically extend along the module's x-axis intended for mounting parallel to the ground.

Lateral faces generally are flat or about flat, with intersections of adjacent faces forming the groove angle or the peak angle alpha. The structured layer (9) typically realizes a groove angle beta between the lateral faces of said grooves of depth less than h2, and an apex angle alpha, each from the range 40 to 120°, especially 65 to 105°, most preferably 70 to 100°. The groove angle gamma between lateral faces of grooves of depth h2 thus is determined as:

gamma=2alpha−beta.

In a preferred photovoltaic module of the invention, the structured layer (9) comprises neighbouring grooves of depth h2 and of depth (h2−h1), wherein h1 ranges from 0.3 h2 to 0.7 h2, and especially from 0.4 h2 to 0.7 h2.

The period of parallel grooves in present structured layer (9, shown as base length B in FIG. 3, denoting the smallest distance between two grooves of depth h2) is typically from the range 10 to 500 micrometer, especially 15 to 500 micrometer, and preferably 15 to 150 micrometer.

For a typical embodiment, present parameters such as h1, h2, alpha and beta are chosen from the ranges given above and are applied constantly, or about constantly, throughout the whole structured layer.

Materials and Methods

The invention thus includes a method for the manufacturing of a photovoltaic module comprising bifacial PV cells, a front side designed for receiving direct sunlight, and a rear side made of a transparent material, typically designed for receiving scattered light, which method comprises the step of structuring the module's transparent rear surface with a plurality of parallel V-shaped grooves, characterized in that each pair of neighbouring grooves comprises one groove of depth h2 and one groove of depth (h2−h1), wherein h2 is from the range 5 to 200 micrometer, especially 10 to 60 micrometer, and h1 ranges from 0.1 h2 to 0.9 h2, preferably from 0.1 h2 to 0.8 h2, and wherein the adjacent lateral faces of grooves of depth (h2−h1) form a groove angle beta, and adjacent faces of neighbouring grooves form a peak of apex angle alpha.

The structured layer (9) is generally prepared from a resin material which is transparent and curable by application of heat and/or radiation, or by suitable embossing of a transparent polymer material. The structured layer (9) may be applied directly onto the back sheet (7), or embossed into it in case that a polymeric back sheet is used, or the structured layer (9) may be applied on, or embossed into, a polymer film (10) as a transparent substrate, which polymer film carrying the structured layer (9) is then applied to the back sheet (7), preferably using a suitable adhesive between the module's rear surface (e.g. back sheet (7)) and carrier film (10). Examples for the application of present structured layer (9) with its carrier film (10) on the PV module's rear surface are shown in FIGS. 4-6.

In one embodiment, the photovoltaic module according to the invention thus contains the transparent structured layer (9) comprising a resin cured by actinic radiation, especially UV radiation. The latter embodiment is of specific technical interest, especially where a UV curable resin layer is applied to a substrate such as a PET film, structured by an imprinting process and cured by UV light, thereby forming the structured layer (9) on said substrate film or layer.

The laminate obtained after preparing layer (9) on substrate film (10) is subsequently applied to the back sheet (7) or directly onto the encapsulant (2).

The most preferred configurations of the present module thus comprise:
  Back sheet consisting of a structured UV coating on the PET core; or
  glass back sheet covered by structured UV-coating (without PET substrate), optionally with an adhesive on the glass plate.

Other preferred configurations comprise a structured UV-coating (9) on PET film (10), applied with an adhesive on the rear side of the module (onto glass or polymer).

One process may be an imprinting process and, preferably, a roll-to-roll imprinting process. In a preferred embodiment, the laminate carrying the structured layer (9) is prepared as a single construction by an UV imprinting process. In another embodiment, the coated substrate is prepared from a radiation curable (meth)acrylate material, and the molded (meth)acrylate material is cured by exposure to actinic radiation. For example, a curable polymeric material may be coated on a substrate film (10 or 7) and pressed against a microstructured molding tool and allowed to cure e.g. by UV irradiation to form the structured layer (9) on the substrate film. Upon removal of the molding tool, the structured layer (9) is formed. The structure on the imprinted surface (9) is the inverse of structure on the tool surface, that is to say a protrusion on the tool surface will form a depression on the imprinted surface, and a depression on the tool surface will form a protrusion on the imprinted surface.

Optionally, the resulting product comprising carrier film (10) and structured layer (9) may be cut into strips of appropriate size and applied to the back sheet (7) to overlap with the area free of solar cells. Preferably, the strip has at least the same size and shape as the area (gap) between the solar cells (FIG. 5).

For such an assembly, a better adhesion on the back sheet (7), which usually comprises glass or polymer film, is achieved by putting an adhesive promoter the surface of the substrate side without structure.

In another embodiment, layer (9) is applied directly on the back sheet (7), which may be glass or a polymer material described further below, over the full surface or sequentially in analogy to FIG. 4 or 5 (i.e. without carrier film 10, other than shown in said Figures).

In another embodiment, layer (9) replaces the outer layer of the back sheet (7) or is part of the back sheet (7), especially where a polymer film or sheet, or the encapsulation material (2) itself such as EVA, also forms the module's rear surface; an example with structured layer (9) on carrier film (10) applied onto the module's rear surface formed by the encapsulant material without back sheet (7) is shown by FIG. 6.

In case that a resin material curable by heat and/or radiation is used for preparing the structured layer (9), a UV curable resin is preferred. In this case, the binder essentially comprises monomeric or oligomeric compounds containing ethylenically unsaturated bonds, which after application are cured by actinic radiation, i.e. converted into a crosslinked, high molecular weight form. Where the system is UV-curing, it generally contains a photoinitiator as well. Corresponding systems are described inter alia in Ullmann's Encyclopedia of Industrial Chemistry, 5th Edition, Vol. A18, pages 451-453. The UV resin composition may further contain a stabilizer such as a UV absorber and/or a sterically hindered amine (HALS).

Dual cure systems, which are cured first by heat and subsequently by UV irradiation, or vice versa, comprise components containing ethylenic double bonds capable to react on irradiation with UV light, typically in presence of a photoinitiator.

The electromagnetic radiation thus preferably is UV light, and the radiation curable coating typically is a UV curable coating. Cure of the UV curable coating (UV lacquer) during the transfer step may be accomplished in analogy to methods described in WO 12/176126. Preferred curing wavelengths are, for example, from the short wavelength range 220-300 nm, especially 240-270 nm, and/or from the long wavelength range 340-400 nm, especially 350-380 nm, as achievable e.g. by LED curing.

The structured layer (9) may alternatively be prepared by embossing. In this process, a flat film with an embossable surface is contacted to a structured tool with the application of pressure and/or heat to form an embossed surface. The entire flat film may comprise an embossable material, or the flat film may only have an embossable surface. The embossable surface may comprise a layer of a material that is different from the material of the flat film, which is to say that the flat film may have a coating of embossable material at its surface. The structure on the embossed surface is the inverse of structure on the tool surface, that is to say a protrusion on the tool surface will form a depression on the embossed surface, and a depression on the tool surface will form a protrusion on the embossed surface.

A broad range of methods are known to those skilled in this art for generating microstructured molding tools. Examples of these methods include but are not limited to photolithography, etching, discharge machining, ion milling, micromachining, diamond milling, diamond drilling, and electroforming. Microstructured molding tools can also be prepared by replicating various microstructured surfaces, including irregular shapes and patterns, with a moldable material such as those selected from the group consisting of crosslinkable liquid silicone rubber, radiation curable urethanes, etc. or replicating various microstructures by electroforming to generate a negative or positive replica intermediate or final embossing tool mold. Also, microstructured molds having random and irregular shapes and patterns can be generated by chemical etching, sandblasting, shot peening or sinking discrete structured particles in a moldable material. Additionally, any of the microstructured molding tools can be altered or modified according to the procedure taught in U.S. Pat. No. 5,122,902 (Benson). The tools may be prepared from a wide range of materials including metals such as nickel, copper, steel, or metal alloys, or polymeric materials.

The encapsulant (2) and any further polymer film or layer, if present, in a PV module of the invention is typically made from a thermoplastic polymer material, with the exception of the present structured layer (9) and any optional adhesive layer.

The substrate (7) may comprise one or more layers and can be made of transparent materials such glass and/or polymers. The substrate film (10) is a polymer film, typically comprising a thermoplastic polymer. Useful thermoplastic polymers include polyethylene terephthalate (PET), polymethylmethacrylate (PMMA), polyethylene (PE), polystyrene (PS), polypropylene (PP), polycarbonate (PC) or cyclic olefin (co)polymers (COC/COP) or other common thermoplastics combined or not with thermoset polymers like for example polyimide (PI), cellulose triacetate (TAC). The index of refraction of these transparent materials often is from the range 1.4 to 1.7, typically from the range 1.4 to 1.6. In special case of birefringence (especially PET) the index of refraction along the plane of the substrate may be higher than 1.6.

Any polymer layer used as back sheet (7), substrate film (10) or encapsulant (2) embedding the PV cells is a transparent polymer material, which is often selected from polycarbonate, polyester (e.g. PET), vinyl polymers such as polyvinyl alcohol, polyvinylbutyral, or ethylene vinyl acetate (EVA), including acrylics like polymethylmethacrylate, and the like. Examples for encapsulants (2) are polycarbonate, poly-acrylics such as PMMA, polyvinylbutyral, silicone polymers, polyimide, polystyrene, sty-rene acrylonitrile, polyamide, polyetherimide, polysulfone, cyclic olefin copolymer, and especially EVA. Optical quality of some polymers such as PE or PP can be improved by addition of clarifyers. It may consist of one bulk material (encapsulant) in contact with the structured layer of the invention and back sheet and the PV cells, or it may comprise two or more layers of such material. The thickness of the polymer layer(s) (7), arranged adjacent to the cells and opposite to the side of main incidence of light between structured layer (9) and the PV cells (3), if present, typically reaches up to 2 mm, and often ranges e.g. from 1 micrometer to about 2 mm, preferably its thickness is about 0.1 to 1 mm, especially 0.3 to 0.5 mm. The polymer film (10) may be of the same or a different material as the polymer back sheet (7); it may, alternatively, replace the polymer back sheet (7). A typical material for the polymer film (10) is polyethylene terephthalate (PET). A polymer film (10) may be one-layered or multi-layered. Likewise, polymeric substrate sheets (7) may be one-layered or multi-layered, or a polymer-glass sheet (7) of 2 or more layers may be employed.

Transparent materials useful as adhesive layers are well known in the art and described, for example, in Ullmanns Encyclopedia of Industrial Chemistry 2010, Adhesives; see specifically part 2, applications, edited by Hermann Onusseit, Rainer Wefringhaus et al., sections 4 and 12. Typically, the adhesives useful in the present invention are selected from acrylic polymers such as polymethacrylates. For better adhesion on PET films, surfaces thereof may additionally coated with a suitable primer.

Typically, the front plate (1) carries an antireflective element, which may form the textured surface of the front plate or it may be an antireflective coating applied to said front plate. Coatings typically are transparent or translucent porous materials with index-matching properties, e.g. comprising suitable dielectric particles such as silicon dioxide or alumina in a suitable binder, such as materials disclosed by Wicht et al. (Macromolecular Materials and Engineering 295, 628 (2010)). Coatings may be made of low refractive index materials such as $MgF_2$ or fluoropolymers. The antireflective element may also consist of a multi-layer interference system having alternating layers of a low refractive index material and a high refractive index material. The antireflective element may also be a film with a nanostructured surface, e.g. a film with a moth's eye structure (a structure consisting of a hexagonal pattern of bumps).

A further aspect of the invention is the method of preparing the solar modules.

In a typical method, the preparation of the photovoltaic module comprising PV cells capable of converting light incoming from the front side and from the rear side comprises the step of structuring the module's transparent back side with parallel V-shaped grooves of depth h2 or less than h2, wherein the lateral faces of said grooves of depth less than h2 form a groove angle beta and adjacent faces of neighbouring grooves form a peak of apex angle alpha, characterized in that h2 is from the range 5 to 200 micrometer, especially 10 to 60 micrometer, and each pair of neighbouring grooves comprises one groove of depth h2 and one groove of depth (h2−h1), wherein h1 ranges from 0.1 h2 to 0.9 h2, preferably from 0.1 h2 to 0.8 h2.

The structuring of the module's transparent rear side may comprise the steps:

(a) applying a transparent radiation curable resin layer to a polymer film such as a PET film, (b) structuring said radiation curable resin layer by imprinting with a suitably structured molding tool to obtain V-shaped grooves as described above, (c) curing the structured layer obtained by irradiation, thus obtaining a polymer film comprising a structured and a non-structured side, and (d) applying the polymer film obtained in step (c) with its non-structured side to the back sheet (7), or directly applying said polymer film with its non-structured side onto the encapsulant (2), step (d) optionally comprising application of an adhesive.

Alternatively, the step of structuring the module's transparent rear side may comprise (a) applying a transparent radiation curable resin layer to the back sheet (7) such as a glass sheet, (b) structuring said radiation curable resin layer by imprinting with a suitably structured molding tool to obtain V-shaped grooves as described above, (c) curing the structured layer obtained by irradiation.

In another embodiment, structuring is effected by embossing a polymer film or sheet (7) or (10).

In the solar module of the invention, the photovoltaic cells (3) are preferably silicon cells such as monocrystalline cells or multicrystalline cells, or may be cells based on any other semiconductor material used in PV cells such as organic photovoltaic materials. The cells (3) are bifacial cells.

Typical cells such as silicon cells may be rectangular or rounded, their longest diameter is typically from the range 5 to 20 cm, the smallest diameter is typically from the range 4 to 12 cm. Thickness of the PV cells is typically 0.1 to 1 mm, especially about 100 to 400 micrometer. PV cells (3) typically are crystalline silicon cells, such as cells with planar front and backside, cells with textured frontside and planar backside, or cells with textured front and back side.

PV cells are typically enclosed by a layer (2) of polymeric material such as EVA or polyvinyl alcohol; polymeric material such as EVA or polyvinyl alcohol generally also fills the gap between cells, which often ranges from 1 up to 10 mm, usually from about 2 to 5 mm. Total thickness of the solar module including protective sheet, encapsulant, PV cells, wiring and back sheet covered with the present structured layer typically is from the range 1 to 20 mm, especially 2 to 8 mm.

The invention further pertains to the use of a transparent structured layer (9) as described above on the rear surface of a photovoltaic module comprising PV cells capable of converting light incoming from the front side and from the rear side for improving the module's energy gain.

EXAMPLES

1. Structured Layer on PV Module

A structured layer is prepared utilizing a carrier foil (substrate) and a UV-curable coating in combination with an imprinting process. The substrate is in this case a PET-foil of 175 μm total thickness (Mitsubishi Hostaphan GN 175 CT 01B), which is primered on both sides. A UV-curable coating (based on an urethane acrylate, acrylate monomers, photoinitiators, and respective additives) is applied on the substrate and subsequently brought into contact with an imprinting tool bearing the negative structure of the desired final structure. The imprinting tool and the substrate are pressed against another in a way that the UV-curable coating fills the cavities of the imprinting tools negative structure. While the imprinting tool and the coated substrate are in contact, the coating is cured using UV-radiation. After curing, the imprinting tool and the coated substrate are separated, releasing the substrate with a cured, structured coating layer. During the whole imprinting process, the coating is in contact with the substrate.

A layer consisting of parallel grooves of alternating depth of 20 micrometer (h2) and of 9 micrometer (h2−h1; "W-type cross section") with groove angle 89° (beta) and apex angle 83° (alpha) is obtained as shown in FIG. 3; the base length (B) between two adjacent grooves of depth h2 is 50 micrometer.

The PV module used is full sized comprising bifacial cells, front glass sheet, and polymer backside comprising the sealed cells without glass backsheet (as shown in FIG. 6), 1.68 m (x-axis intended for mounting parallel to the ground)×1.0 m (y-axis intended for mounting tilted to the ground), 60 cells of edge length 156 mm, gap between cells on each side 3 mm resulting in a relative cell area of 96.26% and a relative gap area of 3.74%. The substrate film containing the layer thus structured is applied to the back side of a photovoltaic (PV) module; the length of the structure (L) extends along the module's x-axis over the whole module width of 1.68 m.

For the purpose of comparison, test modules are provided whose backside is covered by the PET substrate film alone (plane, unstructured backsheet), and further by PET substrate films carrying structured layers known from prior art ("V-type" cross section as of U.S. Pat. No. 4,235,643 with groove angle same as apex angle 110°).

2. Modelling

Efficiency of the modules of Example 1 is simulated for the following conditions: For the module (including the structured backside layer), a constant refractive index of 1.5 is set, and a refractive index of 1 for the ambient atmosphere. The module is mounted with its y-axis tilted by 28.56° southwards and irradiated from its front side by a light source following the solar path over the year in Phoenix, Ariz., and from its backside by a light source of Lambert angular distribution simulating diffusive ground reflection. Both light sources are simulated providing light of 550 nm wavelength. Radiation reaching the cells after transmission through, or reflection by, the module's back sheet (following light paths as shown in FIG. 2, percentage of incident radiation after reflection or transmission by back sheet) is calculated using the software LightTools.

(Synopsys, USA). Results for light paths II-IV shown in FIG. 2 are shown in the below Table 1; the calculations show that contributions by light path I are negligible for the present module construction (distance between lower cell surface and structured layer 9 from the range 300-500 micrometer).

TABLE 1

Percentage of incident radiation reaching the solar cell via light paths II-IV for various module back sides

| | Portion (%) in Light Path | | |
| --- | --- | --- | --- |
| Backsheet structuring | II | III | IV |
| none (comparison) | 5.5 | 0.5 | 91.8 |
| "V-type" (comparison) | 43.9 | 23.2 | 92.9 |
| "W-Type" (invention) | 68.4 | 19.7 | 94.2 |

The software Wafer Ray Tracer (accessible at: https://www.2.pvlighthouse.com.au/calculators/wafer%20ray%20tracer/wafer%20ray %20 tracer.html) is used to calculate the fraction of radiation energy transmitted through or absorbed by a standard cell arrangement comprising: Embedding material EVA [Mcl09a], front film SiNx 75 nm PECVD [Bak11], substrate 200 micrometer Si crystalline 300 K [Gre08], rear film 100 nm SiO2 thermal [Pal85e]; wavelength range 300-1200 nm, wavelength interval 20 nm, 5000 rays per run, max total rays 50000, 1000 bounces per ray, intensity limit 0.01). Further considered are 3 typical types of PV cells (crystalline Si) differentiated by their surface morphology (planar, structured with micropyramids, and planar on backside with pyramid structuring on front side; typical dimensions of the micropyramids are 3.536 micrometer height, 54.74° apex angle, 5 micrometer width). The fraction of radiation energy transmitted by each type of cell (J-trans; i.e. source of radiation for light path II), as obtained from this calculation, is for cells with surface type (frontside-backside)

planar-planar: 11%
pyramid-planar: 2%
pyramid-pyramid: 7%.

For the contribution of light incident from the rear side onto the module (herein modelled as light path IV), a rear side irradiance of 20% of the front side irradiance is set, which is typically obtainable with an albedo of 60 to 70% depending on installation conditions.

Summarizing the contributions from direct front side irradiation (not indicated in FIG. 2) and light paths II, III and IV for modules with structured back sides, and comparing with the corresponding result for the module with unstructured back side, yields the gain resulting from the structuring.

Table 2 shows the gain (average energy collected over the day) obtained for PV modules with structured back side compared to the same module with planar (unstructured) back side for different types of cells.

TABLE 2

Energy gain (%) relative to module with unstructured back side for various cell types

| Backsheet structuring | gain for cell type (frontside - backside) | | |
|---|---|---|---|
| | planar-planar | pyramid-planar | pyramid-pyramid |
| "V-type" (comparison) | 5.5% | 1.7% | 3.5% |
| "W-Type" (invention) | 8.5% | 2.3% | 5.2% |

For each type of cell surface, the present "W-type" structuring leads to an improved energy output of the module.

BRIEF DESCRIPTION OF FIGURES

FIG. 4 shows a cross section of a PV module of the invention, the optional substrate film (10) carrying the structured layer (9) on the whole back plate surface of the module back side.

FIG. 5 shows a cross section of a PV module of the invention, the optional substrate film (10) carrying the structured layer (9) attached in certain regions of the back plate in order to cover the gap between the PV cells.

Abbreviations

Figure 1:
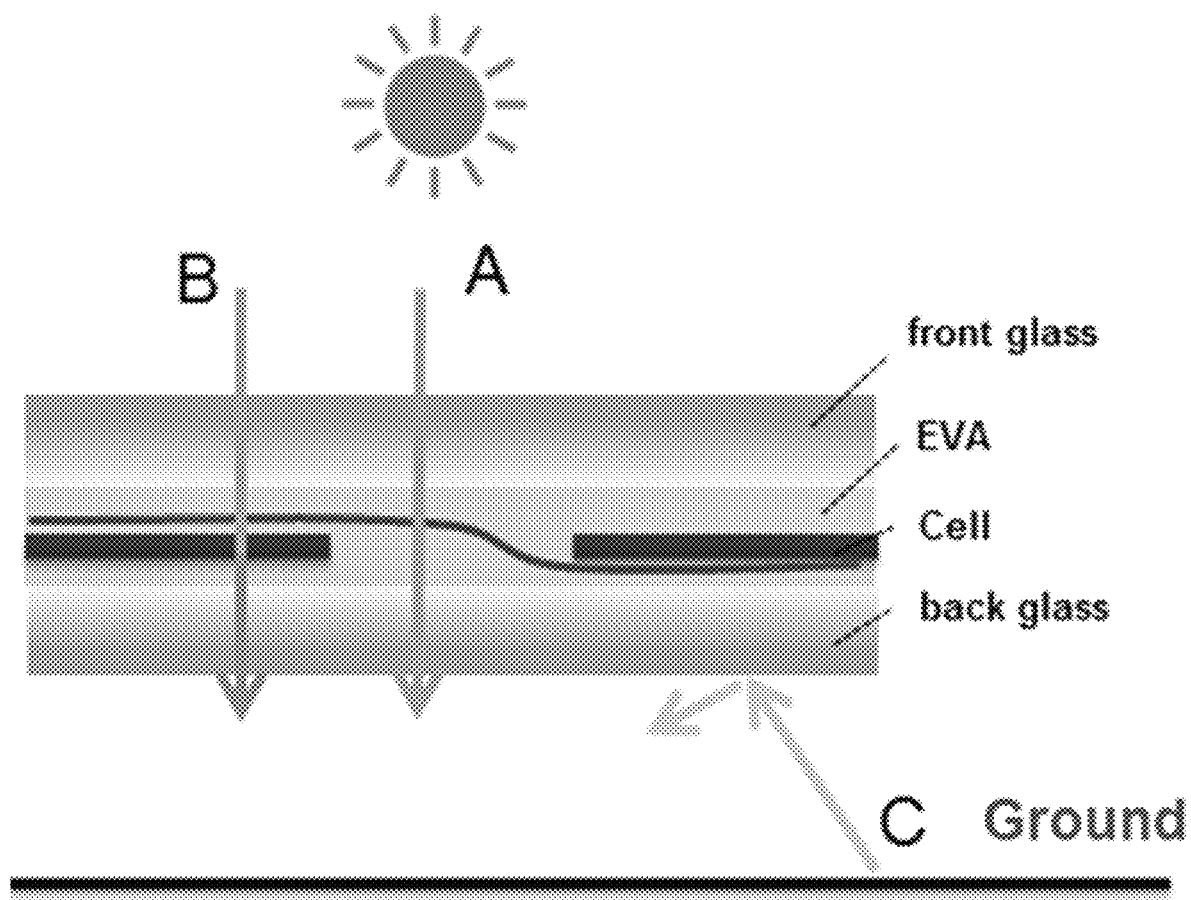
FIG. 1: General functioning of a photovoltaic module comprising cells connected by a wiring (shown as black line) and embedded in a polymeric material (typically EVA), which are covered on top or on both sides with a protecting sheet (here shown as glass sheets). While larger fractions of the sunlight directly falling on the cells (B) is converted into electricity, light falling into the gap between cells (A), light partially transmitted through the cells (B) and light reflected from the ground towards the module's back side (C) often gets lost.
Figure 2:
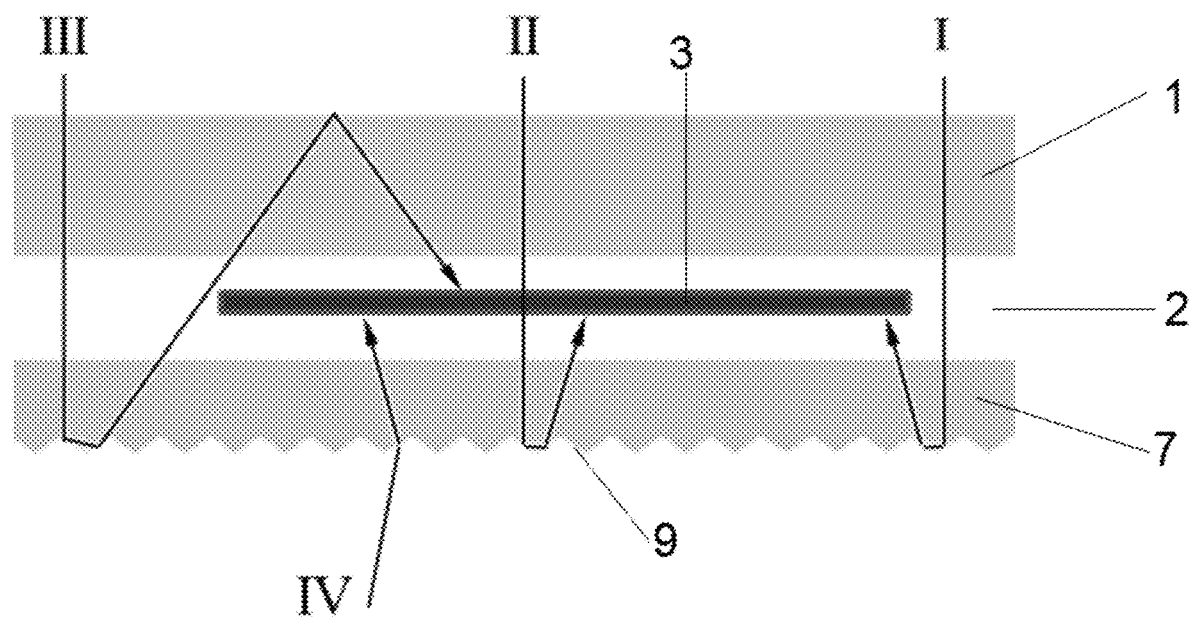
FIG. 2 shows the cross section of the module with front plate (1, typically glass), PV cells (3), encapsulant (2, e.g. EVA), optional back plate (7, e.g. another glass plate) and a structured layer (9) on the back side. Light may be transmitted by the cell (path II) or strike the gap between cells (paths I and III) or enter the module by its transparent back side (path IV). Suitable structuring (9) may result in a reflection of light coming from the front side back towards the cell either directly (paths I and II) or after a further reflection on the front surface (path III), and may provide efficient entry of light from the rear side (path IV).
Figure 3:
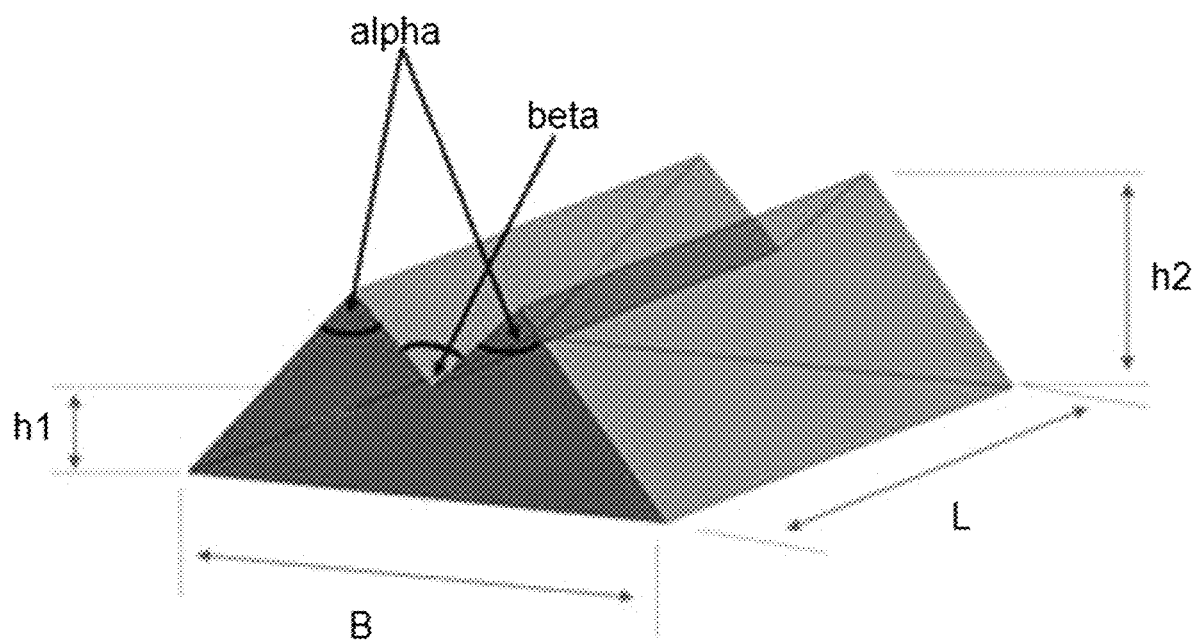
FIG. 3 shows a 3-D view of the structured layer with "W" shaped cross section, which is to be applied to the module's back side according to the invention; the period (shown as base length B), denoting the smallest distance between two grooves of depth h2.
Figure 6:
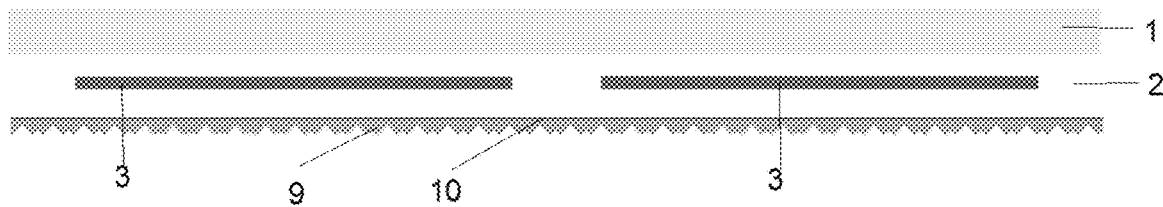
FIG. 6 shows a cross section of a PV module of the invention, the optional substrate film (10) carrying the structured layer (9) on the whole surface of the module back side, which is formed by the encapsulant (2).
Figure 7:
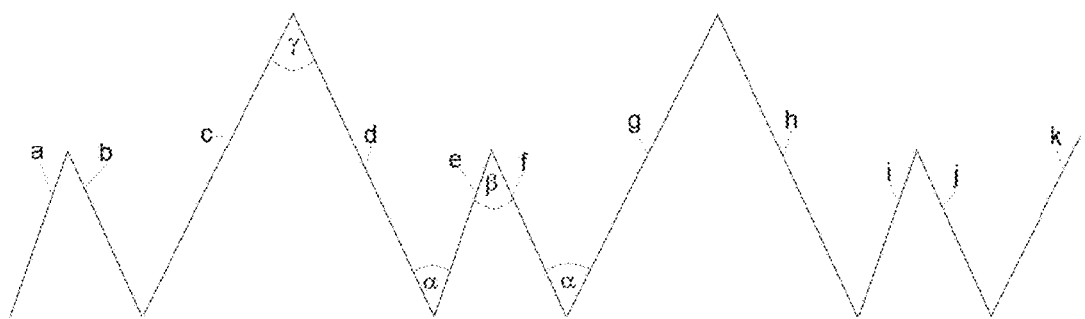
FIG. 7 shows a schematic cross section of present "W" structured layer indicating lateral faces with small letters, where every 4th lateral face (e.g. a, e, i etc.; b, f, j etc.; c, g, k etc.) is oriented in parallel or about parallel direction, and further indicating peak angle alpha and groove angles beta and gamma at some occurrences. In a specific embodiment, every $2^{nd}$ lateral face (e.g. a, c, e, g, i etc.; b, d, f, h, j etc.) stands parallel or about parallel to each other.

B period of present transparent structured layer (base length, FIG. 3)
EVA poly(ethylene-vinyl acetate)
PET poly(ethylene terephthalate)
PV photovoltaic
AM1.5 air mass 1.5 irradiance conditions
HRI high refractive index
Jsc short circuit current density (of PV module)
TIR total internal reflection
mu micrometer Numerals (1) Transparent front sheet (also recalled as front plate) of PV module
(2) Encapsulant material embedding the PV cells
(3) PV cells
(7) Optional Back plate
(9) Transparent structured layer (invention or prior art)
(10) Optional carrier film for structured layer (9)

The invention claimed is:

1. A photovoltaic module comprising one or more bifacial PV cells (3), which module comprises a front side and a rear side, wherein the front side is designed for receiving direct sunlight, and the rear side is made of a transparent material and comprises a rear surface carrying a structured layer (9), wherein the rear surface of the structured layer (9) forms the rear surface of the module's rear side or a fraction of said rear side and is structured by parallel V-shaped grooves, characterized in that
each pair of neighbouring V-shaped grooves comprises one groove of depth h2 and one groove whose depth equals h2−h1,
h2 is from the range 5 to 200 micrometer, h1 ranges from 0.1 times h2 to 0.9 times h2, and
wherein the lateral faces of said grooves of depth h2−h1 form a groove angle beta and adjacent faces of neighbouring grooves form a peak of apex angle alpha.

2. The photovoltaic module of claim 1, wherein beta is larger than alpha.

3. The photovoltaic module according to claim 1, wherein the parallel V-shaped grooves of the structured layer (9) extend along the module's length intended for mounting parallel to the ground.

4. The photovoltaic module according to claim 1, which module comprises more than one bifacial PV cell and a gap area between said bifacial PV cells, and wherein the structured layer (9) covers at least 90% of the gap area between cells.

5. The photovoltaic module according claim 1, wherein the structured layer (9) comprises neighbouring grooves of depth h2 and of depth equaling h2−h1, wherein h1 ranges from 0.3 times h2 to 0.7 times h2.

6. The photovoltaic module according to claim 1 comprising a plurality of PV cells and a gap area between said bifacial PV cells, wherein the structured layer (9) covers the module's rear surface at least below said gap area.

7. The photovoltaic module according to claim 1, wherein the cells are embedded in an encapsulant (2) and positioned between a transparent front sheet (1) and a polymer film (10) and an optional rear plane (7), and wherein
   i) the structured layer (9) covers the polymer film (10), which stands in optical contact with the encapsulant (2) or, if present, the rear plane (7), or
   ii) the structured layer (9) directly covers the rear plane (7) in optical contact, where the module's rear plane is formed by the same material as the encapsulant (2) or is a glass sheet (7) or a polymer layer (7) in optical contact with the encapsulant (2).

8. The photovoltaic module according to claim 7, wherein, apart from the structured layer (9) and an optional adhesive layer, any further polymer film or layer, if present, is made from a thermoplastic polymer material.

9. The photovoltaic module according to claim 1, whose PV cells (3) are crystalline silicon cells.

10. The photovoltaic module according to claim 1, wherein the structured layer (9) comprises a resin cured by actinic radiation or an embossed polymer material.

11. A method for the manufacturing of a photovoltaic module comprising bifacial PV cells, a front side designed for receiving direct sunlight, and a rear side made of a transparent material, as described in claim 1, which method comprises the step of structuring the module's transparent rear side with parallel V-shaped grooves, characterized in that
   each pair of neighbouring V-shaped grooves comprises one groove of depth h2 and one groove whose depth equals h2−h1,
   wherein h2 is from the range 5 to 200 micrometer, and h1 ranges from 0.1 h2 to 0.9 h2, and
   wherein the adjacent lateral faces of grooves of depth h2−h1 form a groove angle beta, and adjacent faces of neighbouring grooves form a peak of apex angle alpha.

12. The method of claim 11, wherein the step of structuring the module's transparent rear side comprises
   (a) applying a transparent radiation curable resin layer to a polymer film,
   (b) structuring said radiation curable resin layer by imprinting with a suitably structured molding tool to obtain V-shaped grooves,
   (c) curing the structured layer obtained by irradiation, thus obtaining a polymer film comprising a structured and a non-structured side, and
   (d) applying the polymer film obtained in step (c) with its non-structured side to the back sheet (7), or directly applying said polymer film with its non-structured side onto the encapsulant (2), step (d) optionally comprising application of an adhesive.

13. The method of claim 11, wherein the step of structuring the module's transparent rear side comprises
   (a) applying a transparent radiation curable resin layer to a back sheet (7),
   (b) structuring said radiation curable resin layer by imprinting with a suitably structured molding tool to obtain V-shaped grooves, and
   (c) curing the structured layer obtained by irradiation.

14. A method of using the transparent structured layer (9) as described in claim 1, the method comprising using the transparent structured layer (9) on a rear surface of a photovoltaic module comprising bifacial PV cells for improving the module's energy gain.

15. The photovoltaic module of claim 1, wherein h2 is from the range 10 to 60 micrometer.

16. The photovoltaic module of claim 1, wherein h1 ranges from 0.1 times h2 to 0.8 times h2.

17. The photovoltaic module of claim 1, wherein beta is larger than 40°.

18. The photovoltaic module of claim 1, wherein both alpha and beta are from the range 40° to 120°.

19. The photovoltaic module of claim 1, wherein the structured layer (9) covers at least 90% of the surface of the module's rear side.

20. The photovoltaic module of claim 1, wherein h1 ranges from 0.4 times h2 to 0.7 times h2.

* * * * *